United States Patent
Watanabe

(10) Patent No.: US 12,372,573 B2
(45) Date of Patent: Jul. 29, 2025

(54) METHOD FOR SETTING UP TEST APPARATUS AND TEST APPARATUS

(71) Applicant: Tokyo Electron Limited, Tokyo (JP)

(72) Inventor: Shinjiro Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 18/264,319

(22) PCT Filed: Feb. 7, 2022

(86) PCT No.: PCT/JP2022/004591
§ 371 (c)(1),
(2) Date: Aug. 4, 2023

(87) PCT Pub. No.: WO2022/176664
PCT Pub. Date: Aug. 25, 2022

(65) Prior Publication Data
US 2024/0118338 A1    Apr. 11, 2024

(30) Foreign Application Priority Data
Feb. 18, 2021   (JP) ................................ 2021-023945

(51) Int. Cl.
*G01R 31/28* (2006.01)
*G01R 1/073* (2006.01)

(52) U.S. Cl.
CPC ..... *G01R 31/2891* (2013.01); *G01R 1/07342* (2013.01); *G01R 31/2887* (2013.01)

(58) Field of Classification Search
CPC .............. G01R 1/0483; G01R 1/06794; G01R 31/2601; G01R 31/2893
See application file for complete search history.

(56) References Cited

U.S. PATENT DOCUMENTS

2009/0237098 A1* 9/2009 Hsu .................. G01R 31/01
                                                                 324/757.03
2018/0356444 A1* 12/2018 Ganapol ............ G01R 31/2893

FOREIGN PATENT DOCUMENTS

JP         H06-349910         12/1994

* cited by examiner

Primary Examiner — Tung X Nguyen
(74) Attorney, Agent, or Firm — IPUSA, PLLC

(57) ABSTRACT

One aspect of the present disclosure relates to a method of setting up a test apparatus that is a method of setting up the test apparatus to test a substrate by bringing a probe into contact with an electrode pad formed on a chip on the substrate that is mounted on a stage. The method includes acquiring a first image including the probe in a probe card that is attached to the test apparatus. The method includes calculating first information including a center of gravity, and an angle, for the probe card, based on probe information including a position of the probe that is calculated based on the first image; and probe information or pad information that is pre-provisioned and corresponds to the probe card. The method includes acquiring a second image including the electrode pad on the substrate mounted on the stage. The method includes calculating second information including a center of gravity of the chip and an angle for the substrate, based on pad information that includes a position of the electrode pad and is calculated based on the second image; and pad information that is pre-provisioned and corresponds to the substrate. The method includes outputting the first information and the second information.

7 Claims, 12 Drawing Sheets

FIG.10
PAD INFORMATION GENERATED BASED ON CHIP IMAGE
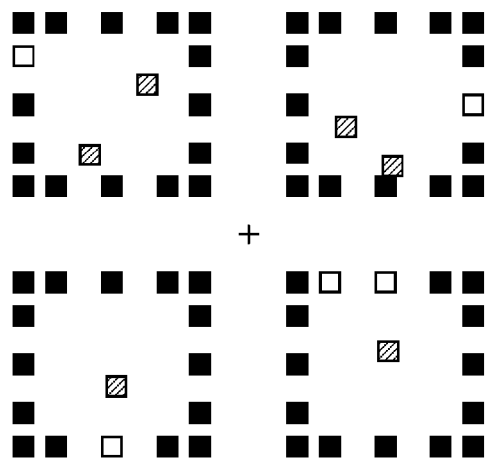
COMPARISON
PRE-PROVISIONED PAD INFORMATION
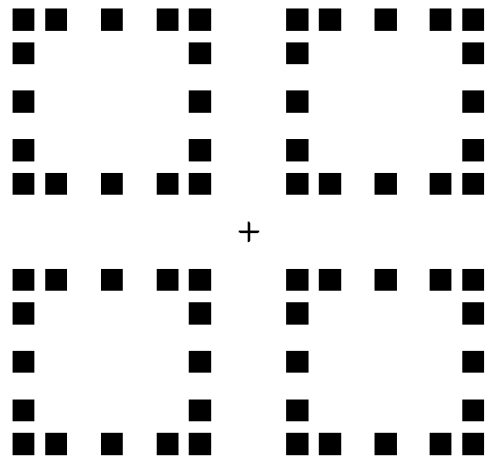

METHOD FOR SETTING UP TEST APPARATUS AND TEST APPARATUS

TECHNICAL FIELD

The present disclosure relates to a method for setting up a test apparatus and the test apparatus.

BACKGROUND ART

With an approach to align needles in a probe card, initial needle alignment for the probe card is enabled automatically without depending on manual work (for example, see Patent Document 1).

RELATED-ART DOCUMENT

Patent Document

[Patent document 1] Japanese Unexamined Patent Application Publication No. H6-349910

SUMMARY

Problem to be Solved by the Invention

The present disclosure provides a technique capable of automatically setting up a test apparatus.

Means for Solving the Problem

One aspect of the present disclosure relates to a method of setting up a test apparatus that is a method of setting up the test apparatus to test a substrate by bringing a probe into contact with an electrode pad formed on a chip on the substrate that is mounted on a stage. The method includes acquiring a first image including the probe in a probe card that is attached to the test apparatus. The method includes calculating first information including a center of gravity, and an angle, for the probe card, based on probe information including a position of the probe that is calculated based on the first image; and probe information or pad information that is pre-provisioned and corresponds to the probe card. The method includes acquiring a second image including the electrode pad on the substrate mounted on the stage. The method includes calculating second information including a center of gravity of the chip and an angle for the substrate, based on pad information that includes a position of the electrode pad and is calculated based on the second image; and pad information that is pre-provisioned and corresponds to the substrate. The method includes outputting the first information and the second information.

Effects of the Invention

In the present disclosure, a test apparatus can be automatically set up.

BRIEF DESCRIPTION OF DRAWINGS

FIG. 10 is a diagram for describing the step of setting up the wafer.

DESCRIPTION OF EMBODIMENTS

Figure 1:
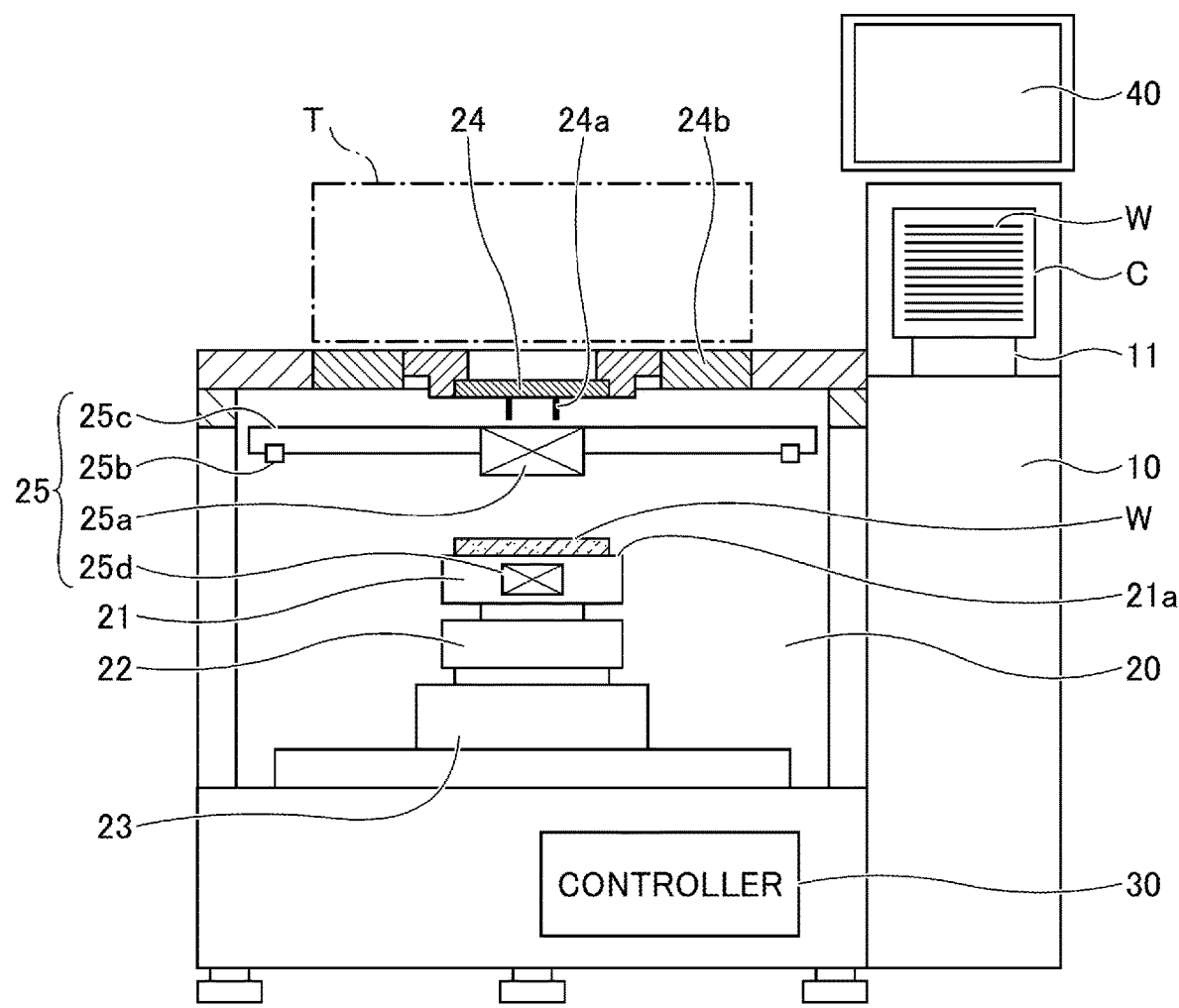
FIG. 1 is a diagram illustrating an example of a test apparatus according to an embodiment.

Non-limiting exemplary embodiments of the present disclosure will be described below with reference to the accompanying drawings. In all of the accompanying drawings, the same or corresponding members or components are denoted by the same or corresponding reference numerals, and redundant description is omitted.

[Test Apparatus]

Figure 2:
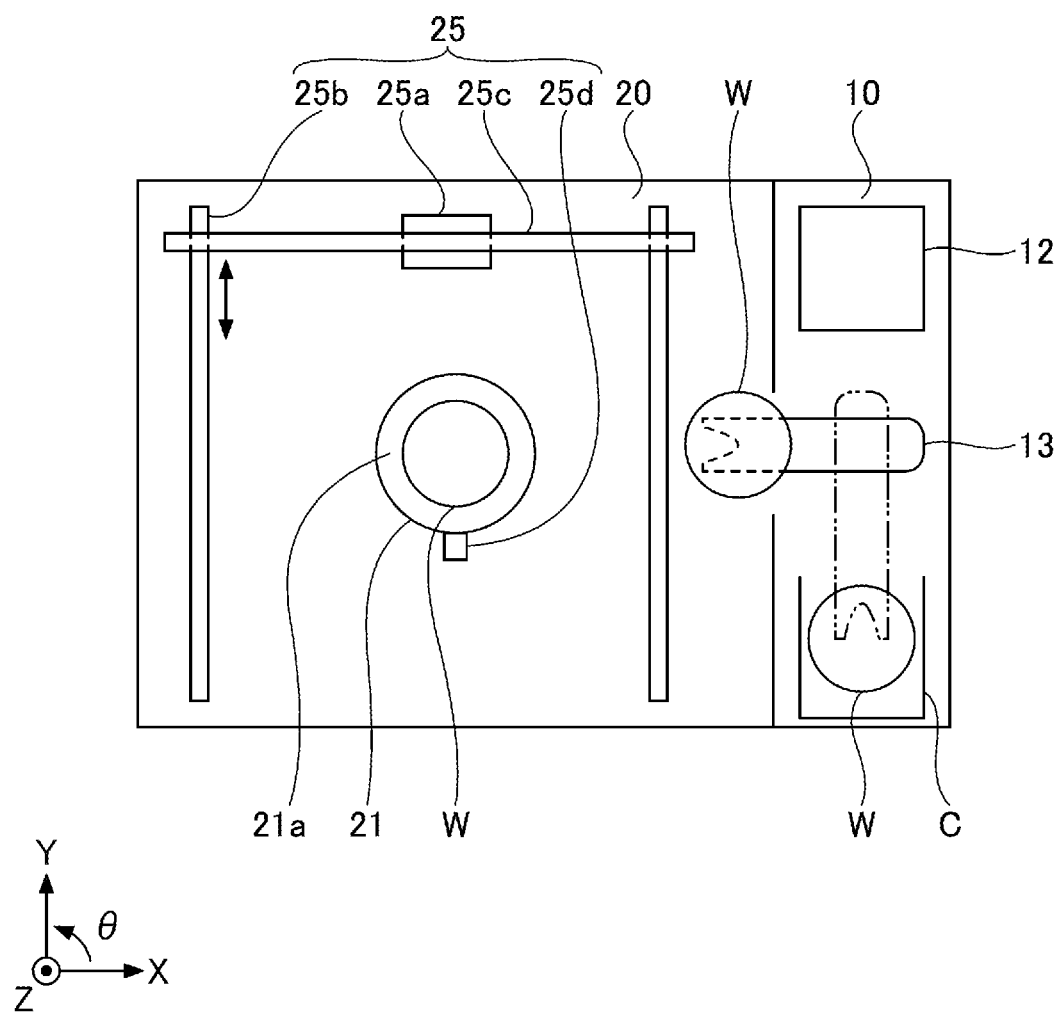
FIG. 2 is a plan view of the test apparatus illustrated in FIG. 1.
Figure 3:
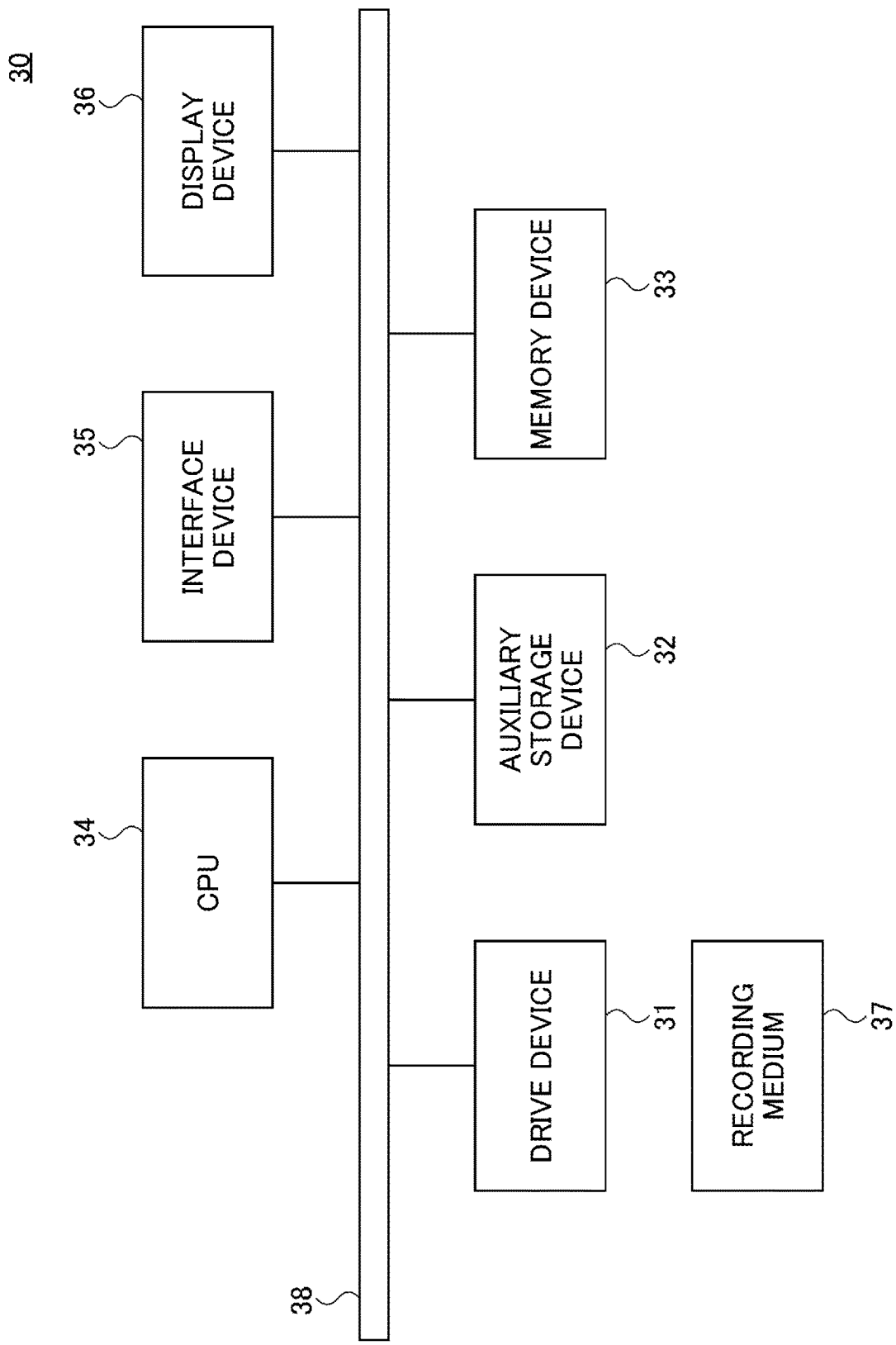
FIG. 3 is a diagram illustrating an example of a hardware configuration of an apparatus controller.

An example of a test apparatus according to an embodiment will be described with reference to FIGS. 1 to 3. The test apparatus according to the embodiment is an apparatus that applies an electric signal to each device under test (DUT) that is formed on a substrate, to inspect various electric characteristics. In the following, a case example in which the substrate is a semiconductor wafer (hereinafter simply referred to as a "wafer") and the device under test is a semiconductor chip (hereinafter simply referred to as a "chip") is described. The semiconductor chip includes one or more electrode pads.

The test apparatus 1 includes a loader unit 10, a test unit 20, and a controller 30.

The loader unit 10 includes a load port 11, an aligner 12, and a substrate transfer mechanism 13. A cassette C that accommodates one or more wafers W is mounted on the load port 11. The aligner 12 aligns the wafer W. The substrate transfer mechanism 13 transfers the wafer W, between the cassette C mounted on the load port 11, the aligner 12, and a stage 21 described below.

In the loader unit 10, the substrate transfer mechanism 13 first transfers the wafer W accommodated in the cassette C to the aligner 12. Next, the aligner 12 aligns the wafer W. Subsequently, the substrate transfer mechanism 13 transfers the wafer W aligned by the aligner 12, to the stage 21 provided in the test unit 20.

The test unit 20 is disposed adjacent to the loader unit 10. The test unit 20 includes the stage 21, a lift-rotation mechanism 22, an XY stage 23, a probe card 24, and an alignment mechanism 25.

The stage 21 has a mounting surface 21a on which the wafer W is to be mounted. The stage 21 is provided to be movable in a horizontal direction (an X-direction and a Y-direction) and a vertical direction (a Z-direction), with respect to a bottom surface of the test unit 20, and is provided to be rotatable about a vertical axis (a θ-direction).

The stage 21 includes a vacuum chuck, and attracts and holds the wafer W mounted on the mounting surface 21a.

The lift-rotation mechanism 22 supports the stage 21 so as to be movable (movable up and down) in the vertical direction (Z-direction) and rotatable about the vertical axis (θ-direction). The lift-rotation mechanism 22 includes, for example, a stepping motor.

The XY stage 23 supports the lift-rotation mechanism 22 so as to be movable in the horizontal direction (the X-direction and the Y-direction). With use of the lift-rotation mechanism 22, the XY stage 23 moves the stage 21 supported by the lift-rotation mechanism 22, in the horizontal direction. The XY stage 23 includes, for example, a stepping motor.

The probe card 24 is disposed above the stage 21. Probes 24a are formed on a stage 21-side of the probe card 24. The probe card 24 is detachably attached to a head plate 24b. A tester (not shown) is coupled to the probe card 24 via a test head T.

The alignment mechanism 25 includes an upper camera 25a, guide rails 25b, an alignment bridge 25c, and a lower camera 25d.

The upper camera 25a is attached to a middle portion of the alignment bridge 25c so as to face downward, and moves in the horizontal direction (in the Y-direction) together with the alignment bridge 25c. The upper camera 25a is provided to align the wafer W on the stage 21, and acquires an image including the wafer W on the stage 21. The upper camera 25a is, for example, a CCD camera or a CMOS camera.

The guide rails 25b support the alignment bridge 25c so as to be movable in the horizontal direction (in the Y-direction).

The alignment bridge 25c is supported by a pair of left and right guide rails 25b, and moves in the horizontal direction (in the Y-direction) along the guide rails 25b.

The lower camera 25d is attached to a side portion of the stage 21 so as to face upward, and moves in the horizontal direction (in the X-direction and the Y-direction) together with the stage 21. The lower camera 25d is provided to detect positions of the probes 24a that are formed on the probe card 24, and acquires an image including the probes 24a. The lower camera 25d is, for example, a CCD camera or a CMOS camera.

In the alignment mechanism 25, with use of the alignment bridge 25c, the upper camera 25a moves between a standby position and a position (hereinafter referred to as a "probe center") that is directly below a center of the probe card 24. During alignment, the upper camera 25a located at the probe center acquires an image including one or more electrical pads of each chip on the wafer W that is mounted on the stage 21, while the stage 21 is moving in the horizontal direction (in the X-direction and the Y-direction), and then outputs the acquired image to the controller 30. Also, the lower camera 25d moves to the probe center by using the stage 21. During alignment, the lower camera 25d located at the probe center acquires an image including the probes 24a that are formed on the probe card 24, and then outputs the acquired image to the controller 30.

The controller 30 is provided below the stage 21, and controls the overall operation of the test apparatus 1. The controller 30 also performs a method for setting up the test apparatus 1 described below. As shown in FIG. 3, the controller 30 is a computer that includes a drive device 31, an auxiliary storage device 32, a memory device 33, a CPU 34, an interface device 35, a display device 36, and the like, which are coupled to one another via a bus 38.

A program that causes the controller 30 to execute a process is provided by a recording medium 37 such as a CD-ROM. When the recording medium 37 that stores the program is set in the drive device 31, the program is installed from the recording medium 37 to the auxiliary storage device 32 via the drive device 31. However, it is not necessary to install the program from the recording medium 37, and the program may be downloaded from any other computer via a network.

The auxiliary storage device 32 stores various information. The various information includes, for example, an installed program, setup provision information to be used in the method for setting up the test apparatus 1 described below, and information to be output in the method for setting up the test apparatus 1 described below.

In response to an instruction to boot a program, the memory device 33 retrieves the program from the auxiliary storage device 32 to store the program.

The CPU 34 implements a function relating to the test apparatus 1 in accordance with the program stored in the memory device 33.

The interface device 35 is used as an interface for a connection to a network.

The display device 36 displays various information, and also functions as an operation unit that receives an operation by an operator or the like.

In the test apparatus 1, the alignment mechanism 25 performs alignment between the wafer W and the probe card 24, such that the probes 24a on the probe card 24 accurately come into contact with the respective pads of each chip on the wafer W that is mounted on the stage 21. Then, the lift-rotation mechanism 22 lifts the stage 21 to bring the probes 24a on the probe card 24 into contact with corresponding electrodes pads. Subsequently, the controller 30 applies a test signal from the tester to each chip on the wafer W by using the test head T and the probe 24a, to inspect an electrical characteristic of each chip.

Prior to implementing chip testing, in the test apparatus 1, an operation (hereinafter referred to as a "setup") of registering the positional relationship between each probe 24a on the probe card 24 and the electrode pad of the chip on the wafer W is performed, where the electrode pad is to contact the probe 24a. Typically, operators or the like implement a portion of a setup, and thus variations in data (hereinafter referred to as "setup data") that is generated in the setup in accordance with individual variations (variations in knowledge, ability, and the like) of the operators and the like occur.

In view of the above situation, in the embodiment, information (hereinafter referred to as "setup provision information") used to set up the test apparatus 1 is preset in an apparatus (for example, the auxiliary storage device 32), and then the controller 30 automatically sets up the test apparatus 1 using the setup provision information. With this arrangement, because the operators or the like do not intervene, setup data is generated without depending on the individual variations of the operators or the like is generated. In addition, for a new type of device (chip), a process in which a setup is implemented and then an electrical characteristic is measured can be automatically performed.

Hereinafter, an example of the setup provision information will be described, and subsequently an example of the method for automatically setting up the test apparatus 1 by the controller 30 will be described.

[Setup Provision Information]

The setup provision information is pre-provisioned in order for the controller 30 to automatically set up the test apparatus 1. The setup provision information includes wafer parameter information, pad information, probe parameter information, and probe information.

The wafer parameter information includes items such as a wafer size (6 inches, 8 inches, 12 inches, or the like), an orientation flat position (0 degrees, 90 degrees, 180 degrees, 270 degrees, or the like), and a chip size (X, Y). The wafer parameter information is information that is generated for each type of the wafer W.

The pad information includes items such as a pad shape (circle, square, octagon, or the like), a pad size (X, Y), a distance (X, Y) from a center of the chip to each electrode pad, and an attribute (four corners or the like) of a reference pad. The pad information includes information on all of the electrode pads that are formed on the chip on the wafer W. The pad information is information in association with the wafer parameter information.

The probe parameter information includes items such as a probe card type (a cantilever type, a vertical type, a MEMS type, or the like) and a needle tip size (X, Y). The probe parameter information is information that is generated for each type of the probe card 24.

The probe information includes items such as a distance (X, Y) from a center of the probe card to each probe 24a, and an attribute (four corners or the like) of a reference pin. The probe information is information in association with probe parameter information.

The wafer parameter information, the pad information, the probe parameter information, and the probe information may be, for example, files that are stored in a text format that is a specified format. The items included in each of the wafer parameter information, the pad information, the probe parameter information, and the probe information described above are examples, and the items are not limited to the examples described above.

[Method for Setting Up Test Apparatus]

An example of the method for setting up the test apparatus 1 according to the embodiment will be described with reference to FIG. 4. Prior to implementing testing, the method for setting up the test apparatus 1 according to the embodiment is performed in a case where, for example, a type of the probe card 24 or a type of the wafer W is changed.

Figure 4:
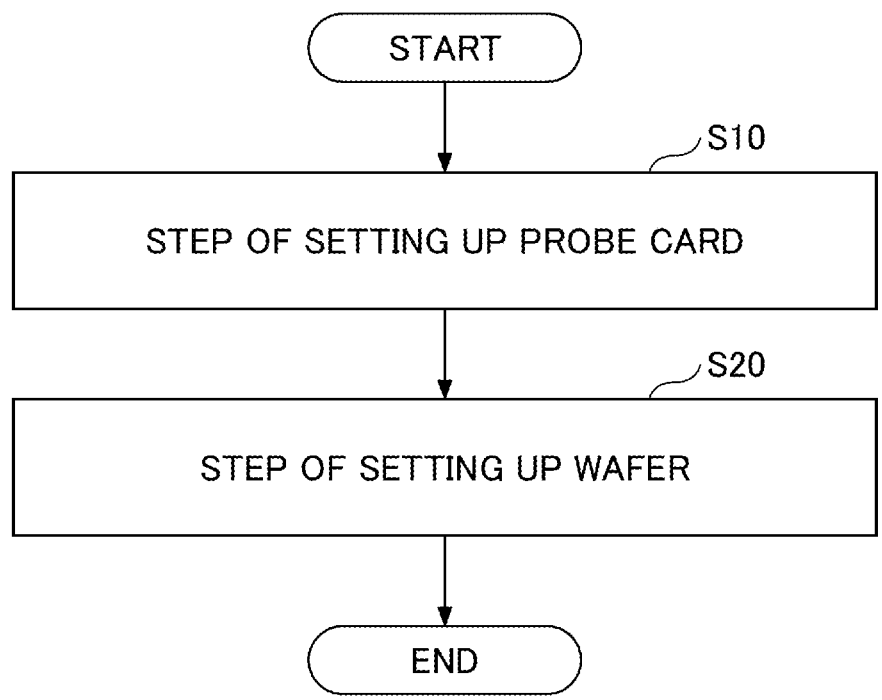
FIG. 4 is a flowchart showing an example of a method for setting up the test apparatus according to the embodiment.

As shown in FIG. 4, the method for setting up the test apparatus 1 according to the embodiment includes a step S10 of setting up the probe card and a step S20 of setting up the wafer. In the present embodiment, a case will be described in which the step S10 of setting up the probe card is first performed, and then the step S20 of setting up the wafer is performed.

However, an order of performing the step S10 of setting up the probe card and the step S20 of setting up the wafer is not limited to the example described above. For example, the step S20 of setting up the wafer is performed, and then the step S10 of setting up the probe card may be performed. For example, the step S10 of setting up the probe card and the step S20 of setting up the wafer may be performed simultaneously.

(Step S10 of Setting Up Probe Card)

Figure 5:
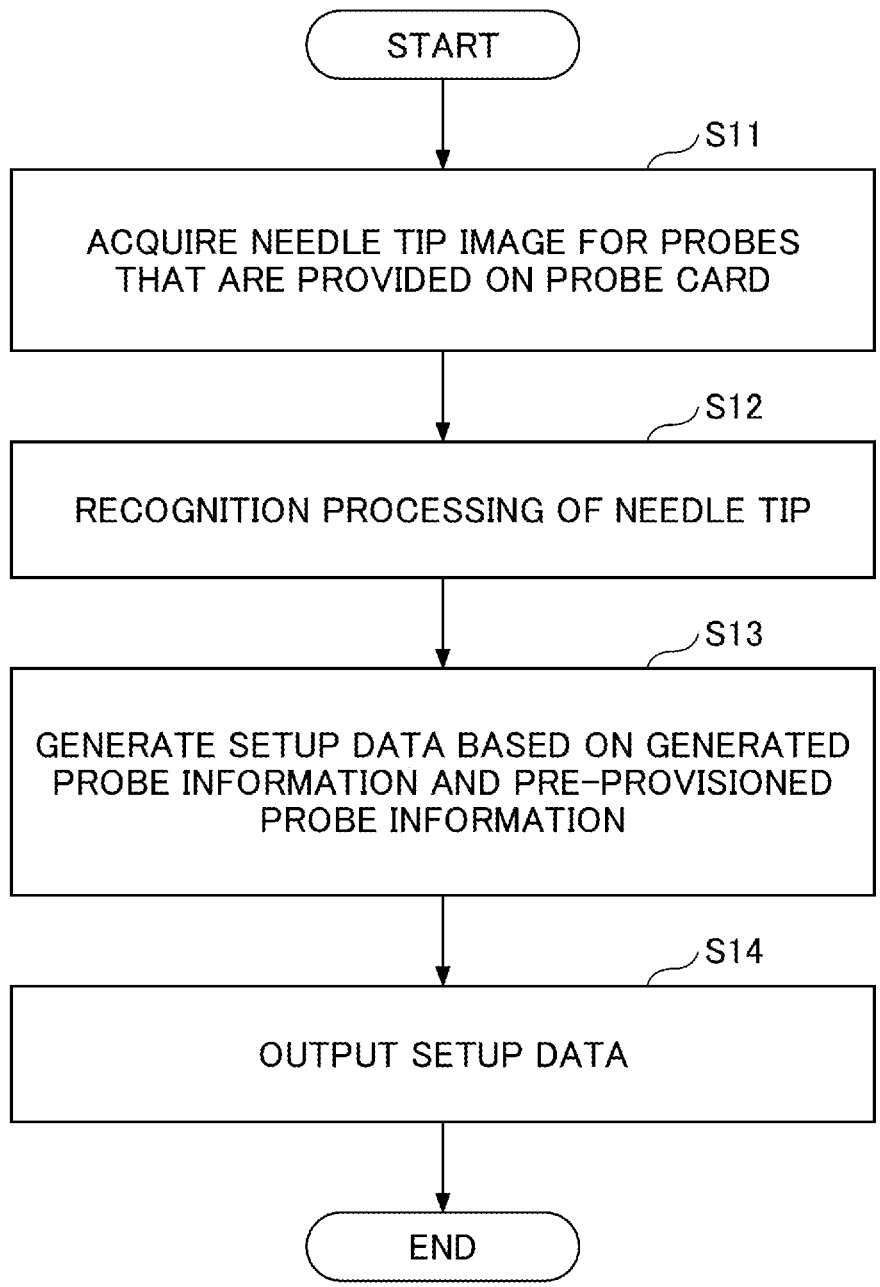
FIG. 5 is a flowchart illustrating an example of a step of setting up a probe card.
Figure 6:
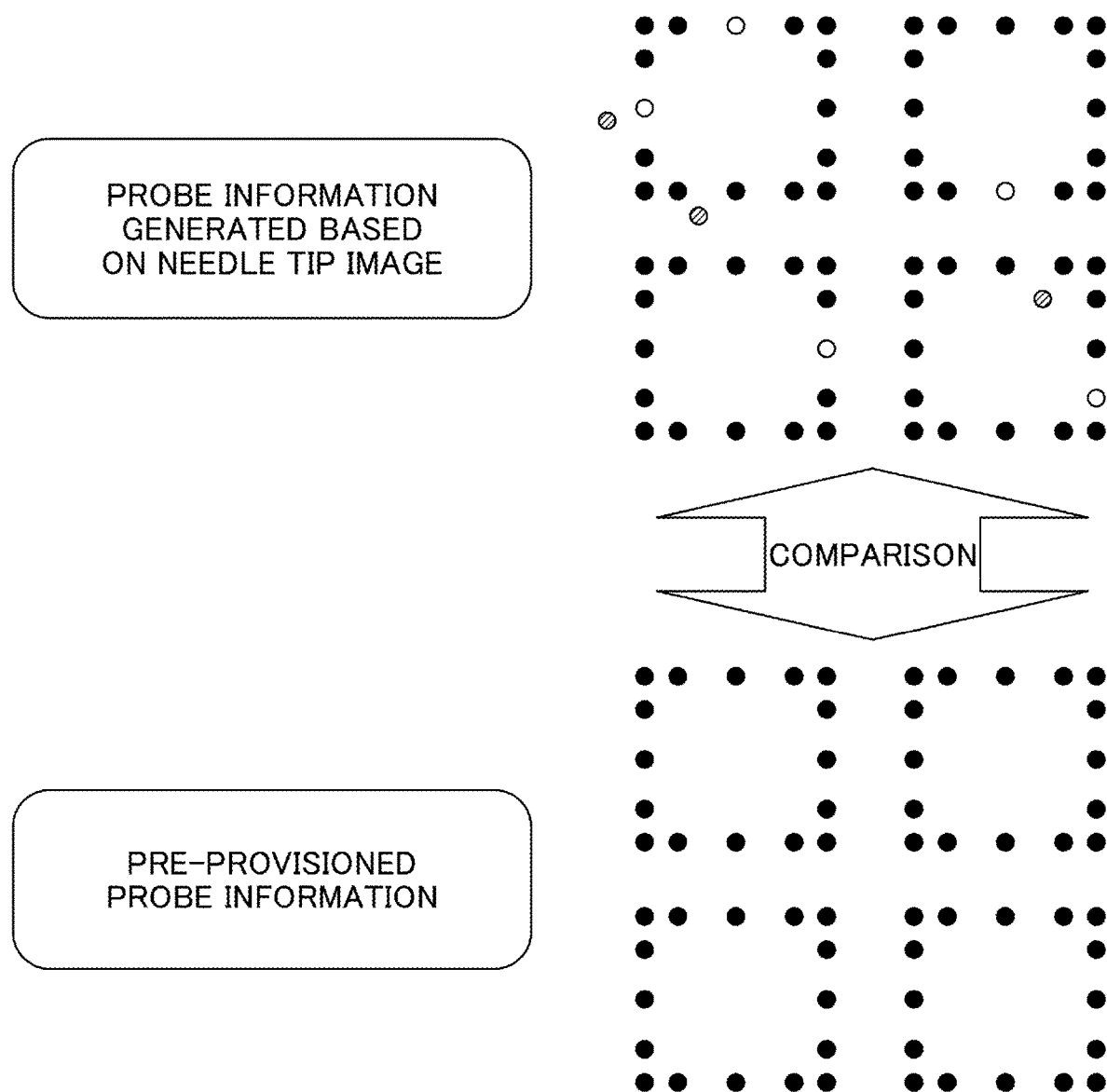
FIG. 6 is a diagram for describing the step of setting up the probe card.

An example of the step S10 of setting up the probe card will be described with reference to FIGS. 5 to 7. FIG. 5 is a flowchart illustrating an example of the step S10 of setting up the probe card. FIG. 6 is a diagram for describing the step S10 of setting up the probe card, and illustrates positional information of probes 24a that are to be used when testing one chip.

First, in step S11, a needle tip image for the probes 24a that are provided on the probe card 24 is acquired. In the present embodiment, the controller 30 controls the XY stage 23 so that the lower camera 25d is moved below the probe card 24. Subsequently, the controller 30 controls the lower camera 25d to acquire an image (needle tip image) including positions of needle tips of all of the probes 24a provided on the probe card 24.

Then, in step S12, recognition processing of a needle tip is performed. In the present embodiment, the controller 30 performs known image processing based on the needle tip image acquired by the lower camera 25d, and recognizes the positions of the needle tips of all of the probes 24a. The controller 30 also generates probe information including a distance (X, Y) from the center of the probe card 24 to each probe of all of the probes 24a.

Then, in step S13, setup data is generated based on the generated setup information and pre-provisioned probe information. In the present embodiment, as shown in FIG. 6, the controller 30 compares each probe position that is included in the generated probe information, against a probe position that is included in the pre-provisioned probe information.

As the result of comparison between the positions, if there is a probe that is present in the generated probe information but is not present in the pre-provisioned probe information, the controller 30 determines that the probe is misidentified (it is false information). Also, the controller 30 deletes the false information from the generated probe information. In FIG. 6, probes that are present in the generated probe information but are not present in the pre-provisioned probe information are indicated by hatched circles.

Also, as the result of comparison between the positions, if there is a probe that is not present in the generated probe information but is present in the pre-provisioned probe information, the controller 30 determines that the probe is a probe that is invisible in the generated probe information (it is lacking information). The controller 30 also adds the lacking information to the generated probe information. In FIG. 6, probes that are not present in the generated probe information but are present in the pre-provisioned probe information are indicated by white circles.

In such a manner, the controller 30 modifies the probe information. The controller 30 also calculates a center of gravity of the probe card 24, and an angle for the probe card 24, based on the modified probe information. In addition, the controller 30 may determine a degree of match between the generated probe information and the pre-provisioned probe information.

In the example shown in FIG. 6, a total number of probes in the pre-provisioned probe information is 64, the number of pieces of false information is 3, and the number of pieces of lacking information is 5. In this case, the controller 30 determines that the degree of match is 0.875 (56/64). For example, if the determined degree of match is greater than or equal to a predetermined threshold, the controller 30 determines that the generated probe information matches the pre-provisioned probe information. The center of gravity of the probe card, the angle for the probe card, and the degree of match are examples of the setup data.

Then, in step S14, the setup data generated in step S13 is output. In the present embodiment, the controller 30 outputs the setup data including the center of gravity of the probe card 24, the angle for the probe card 24, and the degree of match. The controller 30 may also cause the display device 40 to display an image including a result that is obtained by performing the step S10 of setting up the probe card. With this arrangement, the operator or the like can determine whether the setup of the probe card 24 is successfully implemented by checking the image that the display device 40 displays.

Figure 7:
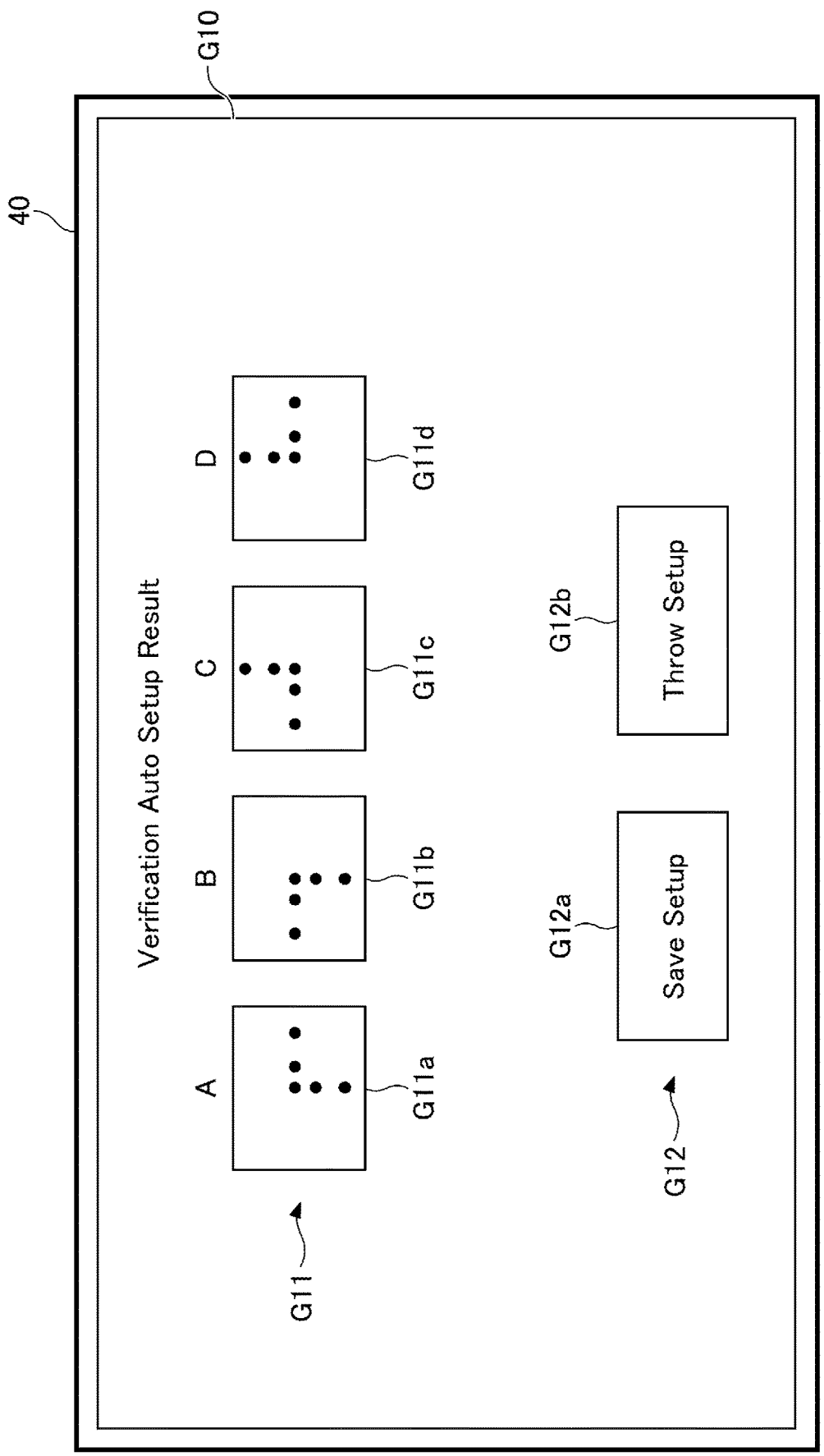
FIG. 7 is a diagram showing an example of an image that a display device outputs in the step of setting up the probe card.

FIG. 7 is a diagram illustrating an example of the image that the display device 40 outputs in step S10 of setting up the probe card. As shown in FIG. 7, an image G10 that the display device 40 outputs includes a probe image display G11 and an operation button display G12.

The probe image display G11 displays images including the probes 24a that are formed on the probe card 24. In the example in FIG. 7, images G11a to G11d each of which indicates one or more probes 24a and that are respectively acquired at four different positions A to D are displayed. The four different positions A to D may be positions that the controller 30 automatically identifies, or may be positions that are designated in advance by the operator or the like.

The operation button display G12 displays images each of which receives an operation to be performed by the operator or the like. In the example in FIG. 7, an image G12a indicative of "Save Setup" for receiving an operation to store a setup result, and an image G12b indicative of "Throw Setup" for receiving an operation to discard the setup result are displayed.

By checking the images G11a to G11d that the probe image display G11 displays, the operator or the like can determine whether the setup of the probe card 24 is successfully implemented. The operator or the like can also store the setup result by selecting (for example, a click or a touch) the image G12a that the operation button display G12 displays. In addition, the operator or the like can discard the setup result by selecting (for example, a click or a touch) the image G12b that the operation button display G12 displays.

The image G10 shown in FIG. 7 is an example, and the image G10 may further include a display that displays any other information. As the display that displays any other information, for example, an enlarged display that displays an image obtained by enlarging each of the images G11a to G11d is used.

In the above example, in step S13, the setup data is generated based on the generated probe information and the pre-provisioned probe information, but is not limiting. For example, in step S13, the setup information may be generated based on the generated probe information and the pre-provisioned pad information. In this case, for example, the controller 30 first provisions probe information based on pad information that is pre-provisioned, and then compares probe position that is included in the generated probe information, against probe position that is included in the probe information provisioned based on the pad information.

(Step S20 of Setting Up Wafer)

Figure 8:
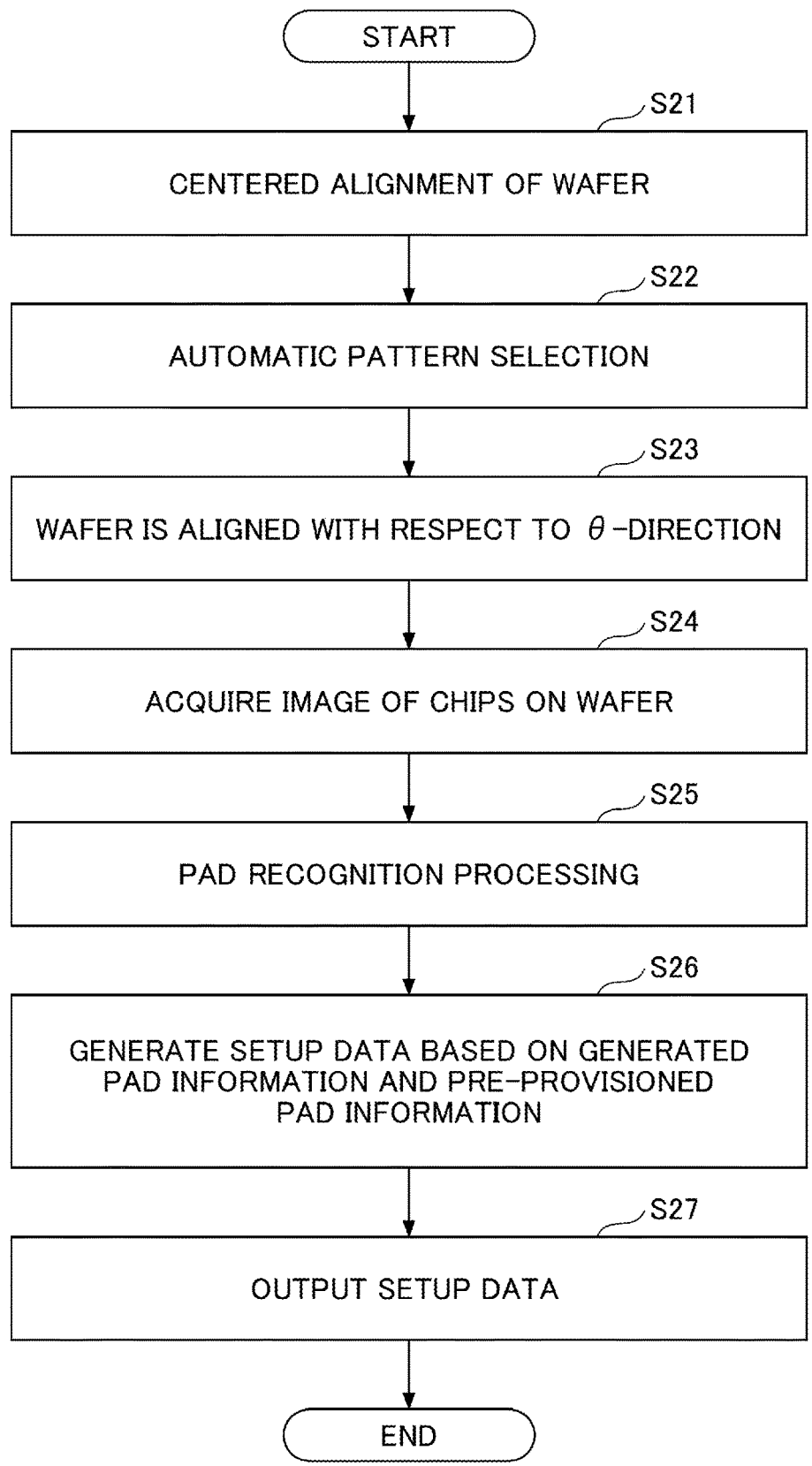
FIG. 8 is a flowchart illustrating an example of a step of setting up a wafer.
Figure 9A:
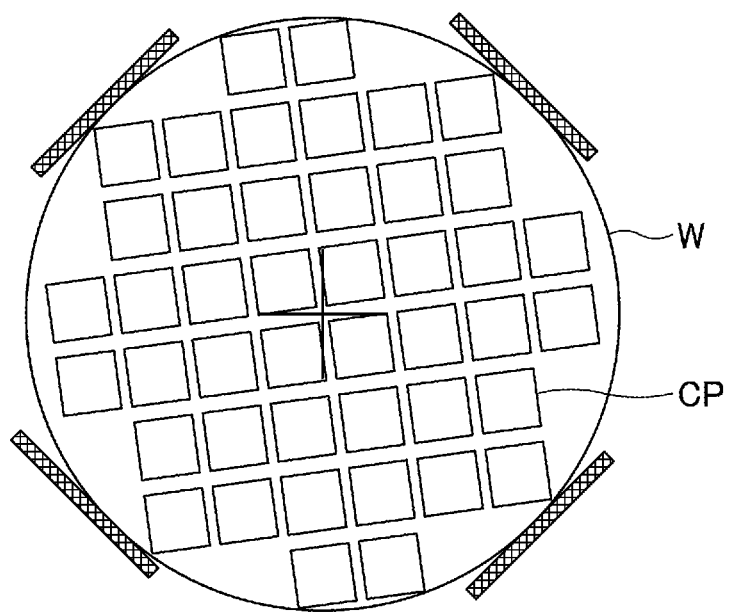
FIG. 9A is a diagram for describing the step of setting up the wafer.
Figure 9B:
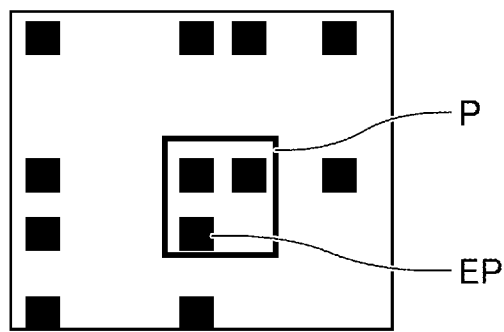
FIG. 9B is a diagram for describing the step of setting up the wafer.
Figure 9C:
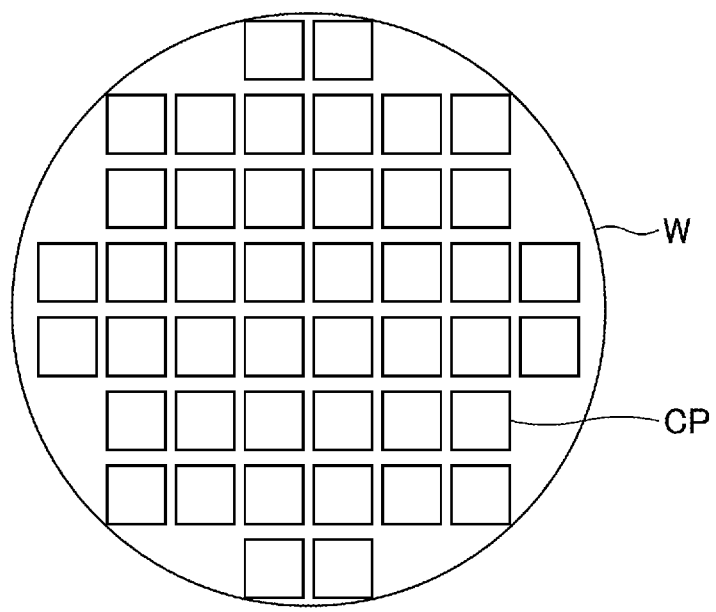
FIG. 9C is a diagram for describing the step of setting up the wafer.

An example of the step S20 of setting up the wafer will be described with reference to FIGS. 8 to 11. FIG. 8 is a flowchart illustrating an example of the step S20 of setting up the wafer. FIGS. 9A to 9C are diagrams for describing the step S20 of setting up the wafer. FIG. 10 is a diagram for describing the step S20 of setting up the wafer, and illustrates positional information of pads of one chip on the wafer W.

First, in step S21, as shown in FIG. 9A, centered alignment of the wafer is performed. In the present embodiment, the controller 30 controls the XY stage 23 so that the stage 21 on which the wafer W is mounted is moved below the upper camera 25a. Then, the controller 30 controls the upper camera 25a to acquire an image of the wafer W. Then, the controller 30 controls the XY stage 23 to move the stage 21 in the horizontal direction based on the image acquired by the upper camera 25a, so that the center of the wafer W coincides with a predetermined position.

Next, in step S22, automatic pattern selection is performed as shown in FIG. 9B. In the present embodiment, in a state where the center of the wafer W coincides with the predetermined position, the controller 30 controls the upper camera 25a to acquire an image of the wafer W including chips CP that are formed on the surface of the wafer W. Then, the controller 30 recognizes and automatically selects a pattern P including one or more predetermined electrode pads EP, from the image of the wafer W acquired by the upper camera 25a.

Then, in step S23, the wafer W is aligned with respect to the θ-direction as shown in FIG. 9C. In the present embodiment, the controller 30 controls the lift-rotation mechanism 22 to rotate the stage 21 such that a rotation angle of the wafer W becomes a predetermined angle (e.g., 0 degrees) based on the pattern selected in step S22.

Then, in step S24, an image of the chips CP on the wafer W that is aligned with respect to the wafer center and the θ-direction is acquired. In the present embodiment, the controller 30 controls the upper camera 25a to acquire the image (chip image) of the chips CP on the wafer W.

Then, in step S25, pad recognition processing is performed. In the present embodiment, the controller 30 performs known image processing based on the chip image acquired by the upper camera 25a, and recognizes positions of all of the electrode pads EP on the chip CP. The controller 30 also generates pad information including a distance (X, Y) from a center of the chip CP to each electrode pad of all of the electrode pads EP.

Next, in step S26, setup data is generated based on the generated pad information and the pre-provisioned pad information. In the present embodiment, as shown in FIG. 10, the controller 30 compares pad position included in the generated pad information, against pad position included in the pre-provisioned pad information.

As the result of comparison between the positions, if there is an electrode pad that is present in the generated pad information but is not present in the pre-provisioned pad information, the controller 30 determines that the electrode pad is misidentified (it is false information). The controller 30 also deletes the false information from the generated pad information. In FIG. 10, electrode pads that are present in the generated pad information but are not present in the pre-provisioned pad information are indicated by hatched squares.

Also, as the result of comparison between the positions, if there is an electrode pad that is not present in the generated pad information but is present in the pre-provisioned pad information, the controller 30 determines that the electrode pad is an electrode pad that is invisible in the generated pad information (that is lacking information). The controller 30 also adds the lacking information to the generated pad information. In FIG. 10, electrode pads that are not present in the generated pad information but are present in the pre-provisioned pad information are indicated by white squares.

In such a manner, the controller 30 modifies pad information. The controller 30 also calculates a center of gravity of each chip CP and an angle for the wafer W, based on the modified pad information. Further, the controller 30 may determine the positional relationship between the center of the wafer W and the center of gravity of the chip CP, based on the revised pad information. In addition, the controller 30 may determine a degree of match between the generated pad information and the pre-provisioned pad information. In the example shown in FIG. 10, a total number of pads in the pre-provisioned pad information is 64, the number of pieces of false information is 6, and the number of pieces of lacking information is 5. In this case, the controller 30 determines that the degree of match is 0.828 (53/64). For example, if the determined degree of match is greater than or equal to a predetermined threshold, the controller 30 determines that the generated pad information matches the pre-provisioned pad information. The center of gravity of the chip CP, the angle for the wafer W, the positional relationship between the center of the wafer W and the center of gravity of the chip CP, and the degree of match are examples of the setup data.

Then, in step S27, the setup data generated in step S26 is output. In the present embodiment, the controller 30 outputs the setup data including the center of gravity of the chip CP, the angle for the wafer W, the positional relationship between the center of the wafer W and the center of gravity of each chip CP, and the degree of match. The controller 30 may cause the display device 40 to display an image including a result that is obtained by performing the step S20 of setting up the wafer. With this arrangement, the operator or the like can determine whether the setup of the wafer W is successfully implemented by checking the image that the display device 40 displays.

Figure 11:
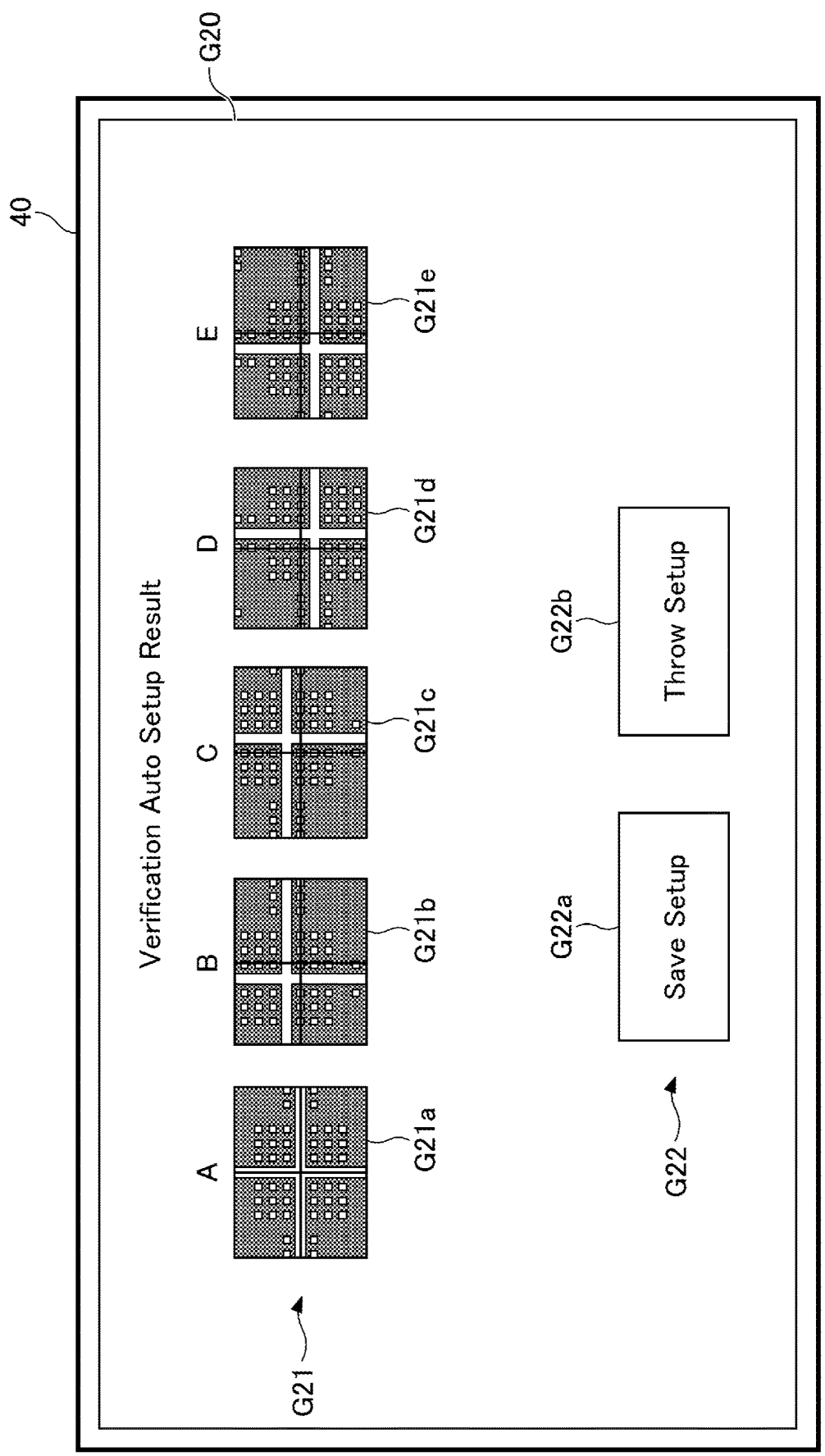
FIG. 11 is a diagram showing an example of an image that the display device outputs in the step of setting up the wafer.

FIG. 11 is a diagram illustrating an example of the image that the display device 40 outputs in step S20 of setting up the wafer. As shown in FIG. 11, an image G20 that the display device 40 displays includes a pad image display G21 and an operation button display G22.

The pad image display G21 displays images including electrode pads of the chip on the wafer W. In the example in FIG. 11, images G21a to G21e each of which indicates one or more electrode pads and that are respectively acquired at five different positions A to E are displayed. The five different positions A to E may be positions that the controller 30 automatically identifies, or may be positions that are designated in advance by the operator or the like.

The operation button display G22 displays images each of which receives an operation to be performed by the operator or the like. In the example in FIG. 11, an image G22a indicative of "Save Setup" for receiving an operation to store a setup result, and an image G22b indicative of "Throw Setup" for receiving an operation to discard the setup result are displayed.

The operator or the like can determine whether the setup of the wafer W is successfully implemented by checking the images G21a to G21e that the pad image display G21 displays. The operator or the like can also store the setup result by selecting (for example, a click or a touch) the image G22a that the operation button display G22 displays. In addition, the operator or the like can discard the setup result by selecting (for example, a click or a touch) the image G22b that the operation button display G22 displays.

The image G20 shown in FIG. 11 is an example, and the image G20 may further include a display that displays any other information. As the display that displays any other information, for example, an enlarged display that displays an image obtained by enlarging each of the images G21a to G21e is used.

In the embodiments described above, the upper camera 25a is an example of a pad information detector, and the lower camera 25d is an example of a probe information detector.

It should be understood that the embodiments disclosed herein are illustrative in all respects and are not restrictive. Various omissions, substitutions, and changes in the form of the above embodiments may be made without departing from the scope and spirit of the accompanying claims.

The above embodiments are described using a case where the test apparatus 1 includes one test unit 20 for one loader unit 10, but the present disclosure is not limited thereto. For example, the test apparatus may be an apparatus that includes multiple test units for one loader unit. For example, the test apparatus may be an apparatus that includes multiple loader units and multiple test units.

This international application claims priority to Japanese Patent Application No. 2021-023945, filed Feb. 18, 2021, the entire contents of which are incorporated herein by reference.

DESCRIPTION OF SYMBOLS 1 test apparatus
21 stage
24 probe card
24a probe
W wafer

The invention claimed is:

1. A method of setting up a test apparatus to test a substrate by bringing a probe into contact with an electrode pad formed on a chip on the substrate that is mounted on a stage, the method comprising:
   acquiring a first image including the probe in a probe card that is attached to the test apparatus;
   calculating first information including a center of gravity, and an angle, for the probe card, based on
      probe information including a position of the probe that is calculated based on the first image, and
      probe information or pad information that is pre-provisioned and corresponds to the probe card;
   acquiring a second image including the electrode pad on the substrate mounted on the stage; and
   calculating second information including a center of gravity of the chip and an angle for the substrate, based on
      pad information that includes a position of the electrode pad and is calculated based on the second image, and
      pad information that is pre-provisioned and corresponds to the substrate; and
   outputting the first information and the second information.

2. The method of setting up a test apparatus according to claim 1, wherein each probe information includes at least one of a distance from a center of the probe card or an attribute of a reference pin.

3. The method of setting up a test apparatus according to claim 1, wherein each pad information includes at least one of a pad shape, a pad size, a distance from a center of a chip, or an attribute of a reference pad.

4. The method of setting up a test apparatus according to claim 1, wherein the first information includes a degree of match between the probe information including the position of the probe that is calculated based on the first image, and the probe information or the pad information that is pre-provisioned and corresponds to the probe card.

5. The method of setting up a test apparatus according to claim 1, wherein the second information includes a degree of match between the pad information including the position of the electrode pad that is calculated based on the second image, and the pad information that is pre-provisioned and corresponds to the substrate.

6. The method of setting up a test apparatus according to claim 1, wherein the second information includes a positional relationship between a center of the substrate and a center of gravity of the chip on the substrate.

7. A test apparatus for testing a substrate by bringing a probe into contact with an electrode pad that is formed on a chip on the substrate, the test apparatus comprising:
   a stage on which the substrate is to be mounted;
   a probe card including a probe that is to contact the electrode pad;
   a controller, the controller being configured to cause
      acquiring of a first image including the probe in a probe card that is attached to the test apparatus;
      calculating of first information including a center of gravity, and an angle, for the probe card, based on
         probe information including a position of the probe that is calculated based on the first image, and
         probe information or pad information that is pre-provisioned and corresponds to the probe card;
      acquiring of a second image including the electrode pad on the substrate mounted on the stage; and
      calculating of second information including a center of gravity of the chip and an angle for the substrate, based on
         pad information that includes a position of the electrode pad and is calculated based on the second image, and
         pad information that is pre-provisioned and corresponds to the substrate; and
      outputting of the first information and the second information.

* * * * *